United States Patent

Solal et al.

[11] Patent Number: 5,936,487
[45] Date of Patent: Aug. 10, 1999

[54] DIFFERENTIAL INPUT/OUTPUT SURFACE ACOUSTIC WAVE DEVICE WITH PROXIMITY COUPLING

[75] Inventors: Marc Solal, Antibes; Pierre Dufilie, Vernon CN, both of France

[73] Assignee: Thomson-CSF, Paris, France

[21] Appl. No.: 09/057,451

[22] Filed: Apr. 9, 1998

[30] Foreign Application Priority Data

Apr. 18, 1997 [FR] France .................................. 97 04831

[51] Int. Cl.$^6$ .................................................. H03H 9/64
[52] U.S. Cl. .................. 333/193; 333/195; 310/313 B; 310/313 D
[58] Field of Search ................... 333/193–196; 310/313 R, 313 B, 313 C, 313 D

[56] References Cited

U.S. PATENT DOCUMENTS

| | | | |
|---|---|---|---|
| 5,020,034 | 5/1991 | Solal et al. ........................... | 367/138 |
| 5,021,699 | 6/1991 | Dufilie ................................. | 310/313 B |
| 5,264,751 | 11/1993 | Dufilie et al. ..................... | 310/313 B |
| 5,307,035 | 4/1994 | Dufilie et al. ........................ | 333/193 |
| 5,357,228 | 10/1994 | Dufilie ................................. | 333/195 |
| 5,365,138 | 11/1994 | Saw et al. .......................... | 310/313 D |
| 5,475,348 | 12/1995 | Hode et al. ......................... | 333/195 |
| 5,550,793 | 8/1996 | Dufilie ................................. | 367/164 |
| 5,581,141 | 12/1996 | Yamada et al. ................. | 310/313 B X |
| 5,703,427 | 12/1997 | Solal et al. ......................... | 310/313 D |
| 5,790,000 | 8/1998 | Dai et al. ........................ | 310/313 B X |
| 5,793,266 | 8/1998 | Allen et al. ............................. | 333/193 |

FOREIGN PATENT DOCUMENTS

WO 97/12441 4/1997 WIPO.

OTHER PUBLICATIONS

B. Wall, A. du Hamél; "Balanced Driven Transversely Coupled Waveguide Resonator Filters", *IEEE Ultrasonics Symposium 1996*, vol. 1, pp. 47–51; Nov. 3–6, 1996, San Antonio, Tx, USA.

*Primary Examiner*—Robert Pascal
*Assistant Examiner*—Barbara Summons
*Attorney, Agent, or Firm*—Oblon, Spivak, McClelland, Maier & Neustadt, P.C.

[57] ABSTRACT

The disclosure relates to differential input/output surface acoustic wave devices with proximity coupling. The disclosed device comprises a whole number N of acoustic channels, where N is at least equal to two. The acoustic channels are coupled together by proximity. A first acoustic channel comprises at least one transducer separated into several parts electrically connected in parallel with one another to form a first differential port (E+) and a second differential port (E−). The polarities of the different parts of the transducer are chosen so that the first differential port (E+) and the second differential port (E−) are electrically symmetrical. Application in particular to surface acoustic wave filters for portable telephones.

13 Claims, 5 Drawing Sheets

DIFFERENTIAL INPUT/OUTPUT SURFACE ACOUSTIC WAVE DEVICE WITH PROXIMITY COUPLING

BACKGROUND OF THE INVENTION

The present invention relates to surface wave devices and especially to surface wave filters with proximity coupling used in many applications, especially in portable telephones.

Surface wave filters use the propagation of acoustic waves on the surface of a piezoelectric substrate, and the filtering characteristics are obtained from the modifications made in the propagation of these waves as a function of their frequency by electrodes appropriately arranged on the surface of the substrate. There are several structures for these electrodes, and a choice is made from among them as a function of the result to be obtained. These structures include, more particularly, structures using resonators transversely coupled by proximity.

The basic principle of a filter with transversely coupled resonators is described herein, for reasons of clarity, by means of a known example of a two-pole filter. A filter of this kind has two resonators each formed by a transducer between two reflector gratings and coupled by proximity. The transducers and reflector gratings usually have an interval of metallization equal to about half a wavelength. The first resonator is connected to the input of the filter and the second resonator to the output. The input resonator includes a comb-shaped electrode whose fingers are interdigitated with the fingers of a ground electrode. The acoustic waves thus generated by this transducer are emitted towards the right and left towards reflectors formed by fingers parallel to the fingers of the transducers and obtained by cutting out the ground electrode. The resonator connected to the output is symmetrical with the resonator connected to the input with respect to an axis parallel to the direction of propagation of the acoustic waves generated by the input resonator. It has a transducer and two reflectors. Since the ground is common, the corresponding ground electrode is all in one block and is connected to a ground output. The coupling of the two resonators is achieved by proximity, by bringing them together. Thus, it may be considered that the structure is approximately equivalent to the one obtained by bringing two waveguides together. Each of the modes of propagation of the guides considered alone is converted into two modes, a symmetrical mode and an antisymmetrical mode. When the distance between the two resonators is great, the speeds of the acoustic waves in these two modes are very close to each other and substantially equal to the speed of the mode of an isolated waveguide. The coupling is then very weak. This fact is all the more obvious as the resonators are at a distance. When the distance between the two resonators diminishes, the speed of the waves in the two modes diverges and the coupling increases. It can be shown that the equivalent diagram of a structure of this kind corresponds approximately to that obtained for two coupled resonators with a coupling equal to a standardized difference between the frequencies $f_s$ and $f_a$ of the two symmetrical and antisymmetrical modes given by the formula:

$$k = 2\frac{f_a - f_s}{f_a + f_s}$$

This coupling thus defines the relative passband that can be obtained with this type of filter. In general, a two-pole filter gives an excessively low rate of rejection, as well as a steepness of the flanks of the passband that is far too low. It then becomes necessary to make filters with four to six poles or even more, quite simply by the cascade connection of several two-pole structures.

The drawback of this structure lies in the presence of a central bus used as a common point, this common point being connected to the ground. The characteristic of this bus thus prohibits the use of a differential type of connection. Now a connection of this type is becoming increasingly necessary because of the development of integrated circuits towards a differential structure.

A first way of obtaining a transversely coupled surface acoustic wave filter with a differential structure is known to those skilled in the art (U.S. Pat. No. 5,365,138). This is a transversely coupled two-pole filter with differential inputs and differential or non-differential output wherein the transducer of the resonator connected to the input has been replaced by two different transducers separated by a half-wavelength. The ground is still common and the corresponding electrode is all in one block. By contrast, each of the transducers of the resonator connected to the input is connected to one of the differential inputs.

A structure of this kind thus enables differential operation, at both input and output, by the separation into two parts of the transducer of the resonator connected to the output in the same way as the transducer of the resonator connected to the input. By contrast, this type of filter has a major drawback that lies in the high input impedance of the filter. Indeed, the input impedance of the filter is the sum of the input impedances of each of the transducers for, between the two differential inputs, they are perceived as being series-connected by means of the ground electrode. To overcome this problem, there is another configuration that has a lower input impedance than that of the previous filter. The idea of this filter consists in making direct use of the input transducer in differential mode. This means that the transducer is connected between the + and − differential inputs. A structure of this kind requires the separation of the central bus into two, firstly a ground bus forming part of the resonator connected to the output and secondly a bus connected to one of the differential inputs forming part of the resonator connected to the input.

A structure of this kind thus enables differential operation at input with a low input impedance equal to the impedance of the input transducer. By contrast it has a major drawback as regards differential operation. This drawback is the absence of symmetry between the + differential input and the − differential input.

To overcome this drawback, it is possible to set up a parallel connection of two filters according to the above structure to obtain a two-pole filter with differential inputs (ref.: B. Wall, W. du Hamel: "Balanced driven transversely coupled resonator filters", 1996 IEEE Ultrasonics symposium Proceedings). The symmetry between the + differential input and the + differential input is obtained by reversing the polarity of the transducers to compensate for the reversal of their + and − differential inputs.

This last-named filter structure thus enables differential operation at input with totally symmetrical + and − differential inputs and a very low input impedance equal to the parallel connection of the impedance values of each of the transducers. However, it requires the making of a substantial substrate width.

An aim of the present invention is to overcome the above-mentioned drawbacks.

SUMMARY OF THE INVENTION

To this end, an object of the invention is a surface acoustic wave device using a proximity coupling of a whole number N of acoustic channels, where N is at least equal to two, with a given transduction length, these acoustic channels being positioned in parallel on a substrate and numbered successively 1 to N, wherein said device comprises a first particular acoustic channel comprising at least one transducer, comprising two connection buses extended by electrodes, separated into several parts electrically connected in parallel with one another to form a first differential port and a second differential port, the polarities of the different parts of the transducer being chosen so that the first differential port and the second differential port are electrically symmetrical.

According to one possible embodiment, this surface acoustic wave device furthermore comprises a second particular acoustic channel connected to a third port preferably used as an output of the device.

According to a preferred embodiment of the invention, the device is a surface acoustic wave filter whose first port and second port are used preferably as a first differential input and a second differential input, each of the acoustic channels of the device consisting of a resonator formed by a transducer between two reflector gratings. Each transducer comprises two connection buses extended by electrodes. In this embodiment, the electrical symmetry of the two inputs is obtained by reversing the polarities of the inputs of the two transducers, i.e. the two outer buses (and inner buses respectively) of the two transducers are connected to the two opposite input voltages. This reversal of polarities of the inputs may be compensated for either by shifting the transducers by a half-wavelength or by connecting the electrodes so that an alternation of + and − polarities is preserved at the junction between the two semi-transducers.

Again preferably, the resonator connected to the output of this filter has the same structure as the resonator connected to the input, enabling differential operation at output of the filter as well as at input.

According to another characteristic, the resonator connected to the output of this filter comprises three transducers with lengths equal respectively to about one-fourth, one-half and one-fourth of the total length of transduction of the resonator, these transducers being electrically connected in parallel to form two differential outputs.

Other features and advantages of the invention shall appear clearly in the following description of particular exemplary embodiments. The examples chosen are surface acoustic wave filters formed by several acoustic channels, numbered successively 1 to N, each acoustic channel numbered n being formed by a single resonator identified by the same number n, these channels being arranged in parallel on a substrate. In the description, only the term resonator' is used.

BRIEF DESCRIPTION OF THE DRAWINGS

The description is made with reference to the appended figures, of which.

In these figures, homologous elements bear the same numerical or alphanumerical references.

DETAILED DESCRIPTION OF THE INVENTION

Figure 1:
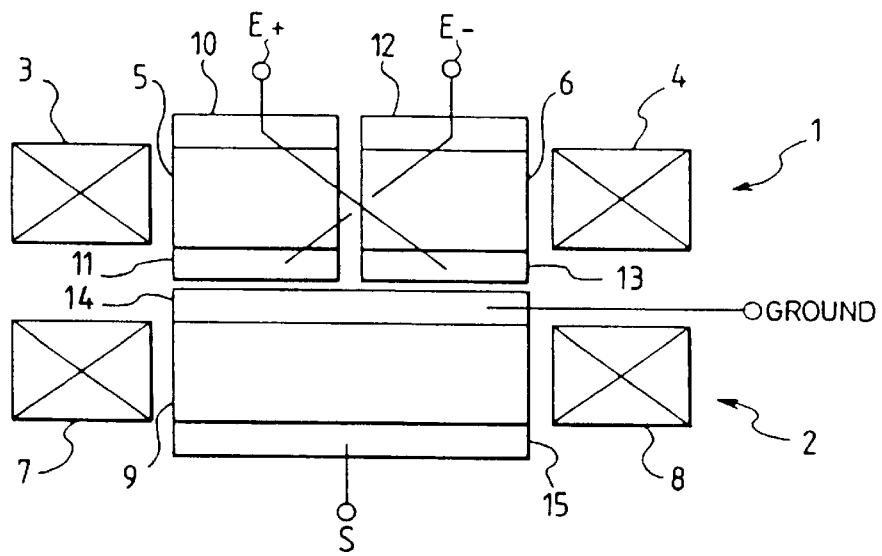
FIG. 1 shows a two-pole filter according to a first embodiment of the invention.

FIG. 1 gives a simple schematic view of the structure of a two-pole filter with differential inputs according to the invention. The filter has two differential inputs E+, E− between which there is applied the signal to be filtered and an output S to restore the filtered signal in relation to a ground reference. The filter consists of two resonators 1 and 2 coupled by proximity. The resonator 1 connected to the differential inputs E+ and E− comprises two reflector gratings 3 and 4 on either side of a transducer separated into two parts to form a first transducer 5 and a second transducer 6. The resonator 2 connected to the output S comprises two reflector gratings 7 and 8 on either side of a single transducer 9. Each transducer 5, 6 and 9 comprises two connection buses, 10 and 11, 12 and 13, and 14 and 15 respectively. The connection bus 14 is connected to the ground. The first transducer 5 is parallel connected with the second transducer 6 to form two differential inputs E+ and E−. The symmetry between the two differential inputs E+ and E− is obtained by reversing the polarity of the connection buses between the first transducer 5 and the second transducer 6. This reversal of polarity appears clearly in FIG. 2 which gives a schematic depiction of the arrangement of the electrodes forming the different transducers and reflector gratings of the two resonators 1 and 2. For reasons of clarity, the structure shown is very simple and in particular comprises a small number of fingers for the electrodes. In reality, the number of fingers of each electrode is far greater and is in conformity with rules well known to those skilled in the art. The first transducer 5 shown within a box of dashes comprises a first electrode 16 connected by means of the connection bus 10 to the differential input E+ and a second electrode 17 connected by means of the connection bus 11 to the differential input E−. The fingers of the two electrodes 16 and 17 are interdigitated to form an alternation of positive and negative electrical polarities and are spaced out by about half a wavelength, $\lambda/2$. $\lambda$ is the wavelength of the center frequency of operation of the filter. The second transducer 6, shown within a box of dashes, is positioned beside the first transducer 5 along the direction of propagation of the surface acoustic waves. The second transducer 6 has a first electrode 18 connected by means of the connection bus 12 to the differential input E− and a second electrode 19 connected by means of the connection bus 13 to the differential input E+. According to this arrangement, the polarities of the connection buses of the transducers 5 and 6 are reversed. This makes it possible to obtain the electrical symmetry of the inputs E+ and E−. Indeed, since the buses 11 and 13 are different from the buses 10 and 12, their impedance values (with reference to the ground and to the output S) are not balanced. The fact of setting up a parallel connection of the buses 10 and 13 and the buses 11 and 12 balances the inputs E+ and E− by the connection, to each of the two inputs, of a bus of each of the two types. By choosing the polarities of the fingers so as to preserve an alternation of the positive and negative electrical polarities, there is obtained a differential input filter whose input impedance is identical to that of a similar filter but for which the transducer of the resonator connected to the input has not been separated into two so as to be used in differential mode.

The resonator 1 connected to the differential inputs E+ and E− is coupled by proximity to the resonator 2 connected to the output S. The resonator 2 connected to the output S comprises a single transducer 9 shown within a box of dashes.

The transducer 9 comprises a first electrode 20, connected to the output S by means of a connection bus 15 and a second electrode 21 connected to the ground by means of a connection bus 14. The example used further above to describe the basic structure of a filter according to the invention is a two-pole filter. It is easy to improve the rejection of the filter according to the invention as well as the steepness of the flanks of the passband by using a three-pole filter with differential inputs. A filter of this kind according to the invention is shown in FIG. 3. As compared with the two-pole filter described here above with reference to FIGS. 1 and 2, the three-pole filter comprises a third resonator 22 placed between the input and output resonators. This third resonator 22 has reflector gratings 23 and 24 and transducer 25 with connection buses 26 and 27. Resonator 22 is coupled by proximity to the resonator 1 connected to the differential inputs E+ and E−, and to the resonator 2 connected to the output S. It is not used as an input or output and is connected to the ground. According to this example, it is possible to build a filter according to the invention with the number of poles greater than three, by adding resonators between the resonator 1 connected to the differential inputs, E+ and E−, and the resonator 2 connected to the output S, or by adding resonators to the substrate, outside the block formed by the resonator 1 and the resonator 2, on the resonator 1 side or on the resonator 2 side.

Figure 4:
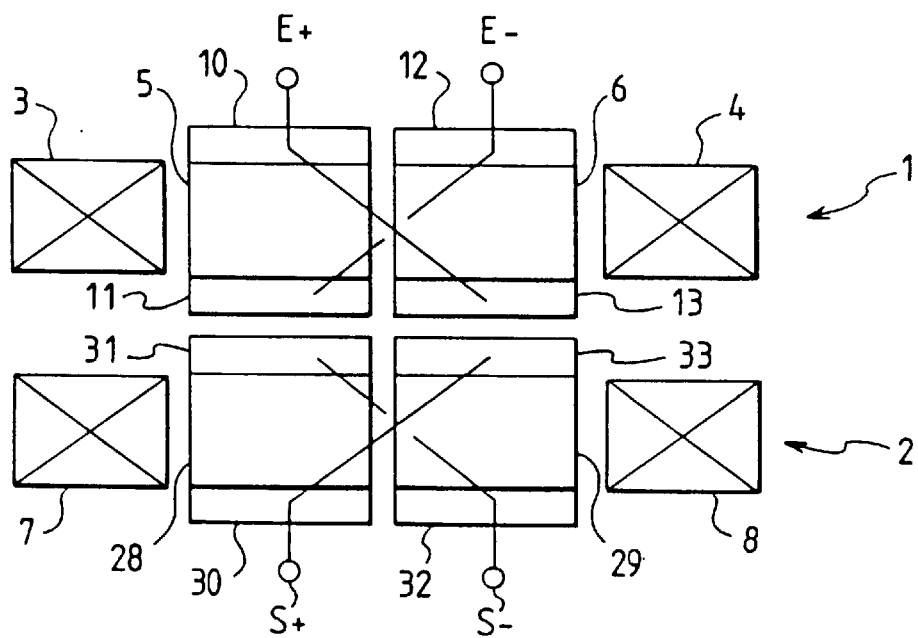
FIG. 4 shows a two-pole filter according to a third embodiment of the invention.

In the examples used here above to describe the invention, the output S is non-differential. However, it is quite possible, within the framework of the invention, to make use, as shown in FIG. 4, of a resonator connected to the output that is identical to the resonator connected to the input. The resonator 2 connected to the differential outputs S+ and S− comprises two reflector gratings 7 and 8 on either side of the transducer separated into two parts to form a first transducer 28 and a second transducer 29. The first and second transducers 28 and 29 each comprises two connection buses, 30 and 31 and 32 and 33 respectively. The first transducer 28 is parallel-connected with the second transducer 29 to form two differential outputs S+ and S−. The symmetry between the differential outputs S+ and S− is obtained by reversing the polarity of the connection buses 30 and 32 on the one hand and 31 and 33 on the other hand between the first transducer 28 and the second transducer 29. The reversal of polarity can clearly be seen in FIG. 5 which gives a schematic view, in the same style as that of the view shown in FIG. 2, of the arrangement of the electrodes forming the different transducers and reflector gratings of the two resonators 1 and 2. The exemplary filter shown in FIG. 5 has a resonator 2 connected to the differential outputs S+ and S−. The structure of this resonator 2 is symmetrical with that of the resonator 1 connected to the differential inputs E+ and E− with respect to the propagation axis of the acoustic waves.

Figure 2:
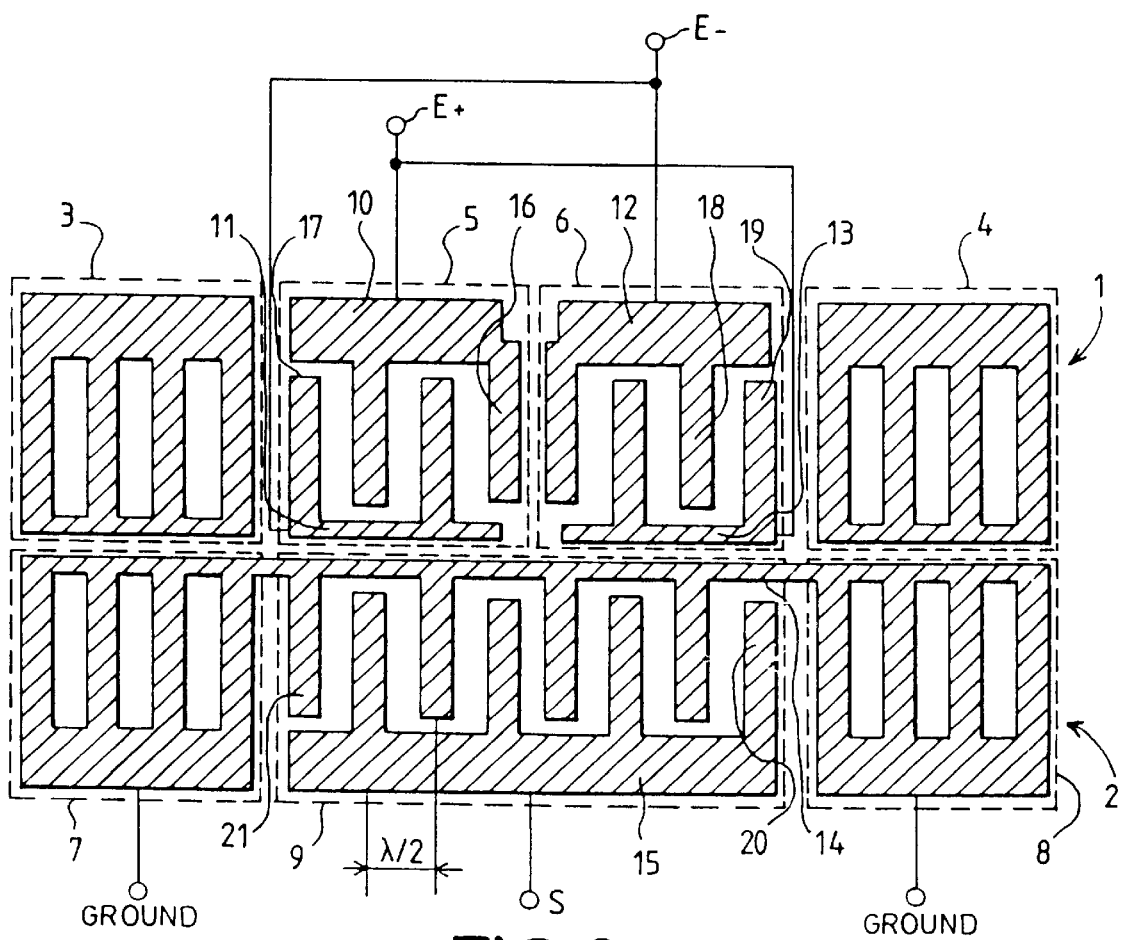
FIG. 2 is a drawing of the electrodes of the filter shown in FIG. 1.
Figure 3:
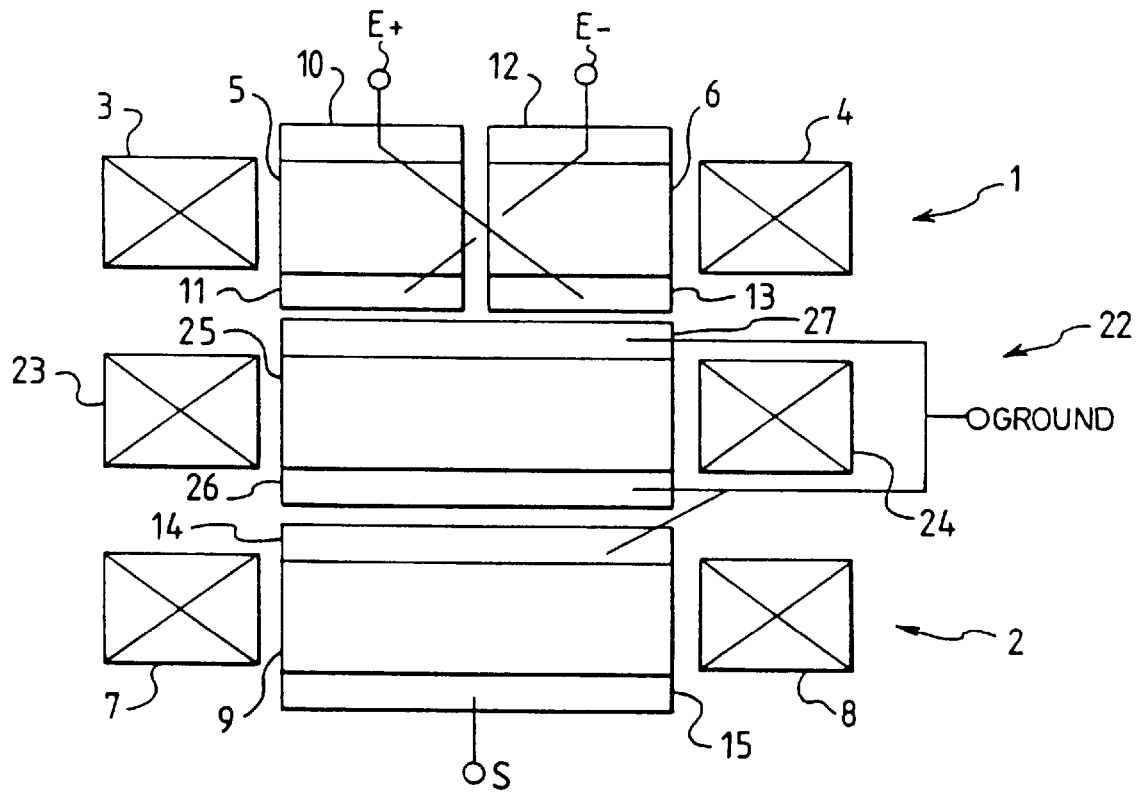
FIG. 3 shows a three-pole filter according to a second embodiment of the invention.

Just as in the case of the non-differential output filter illustrated by FIGS. 1, 2, and 3, it is easy to improve the rejection as well as the steepness of the flanks of the passband of the differential output filter according to the invention by using a three-pole filter. This filter is shown in FIG. 6. In the same way as the filter shown in FIG. 3, the filter shown in FIG. 6 is a three-pole filter obtained with a third resonator placed between the two resonators of the two-pole filter shown in FIGS. 4 and 5.

Figure 5:
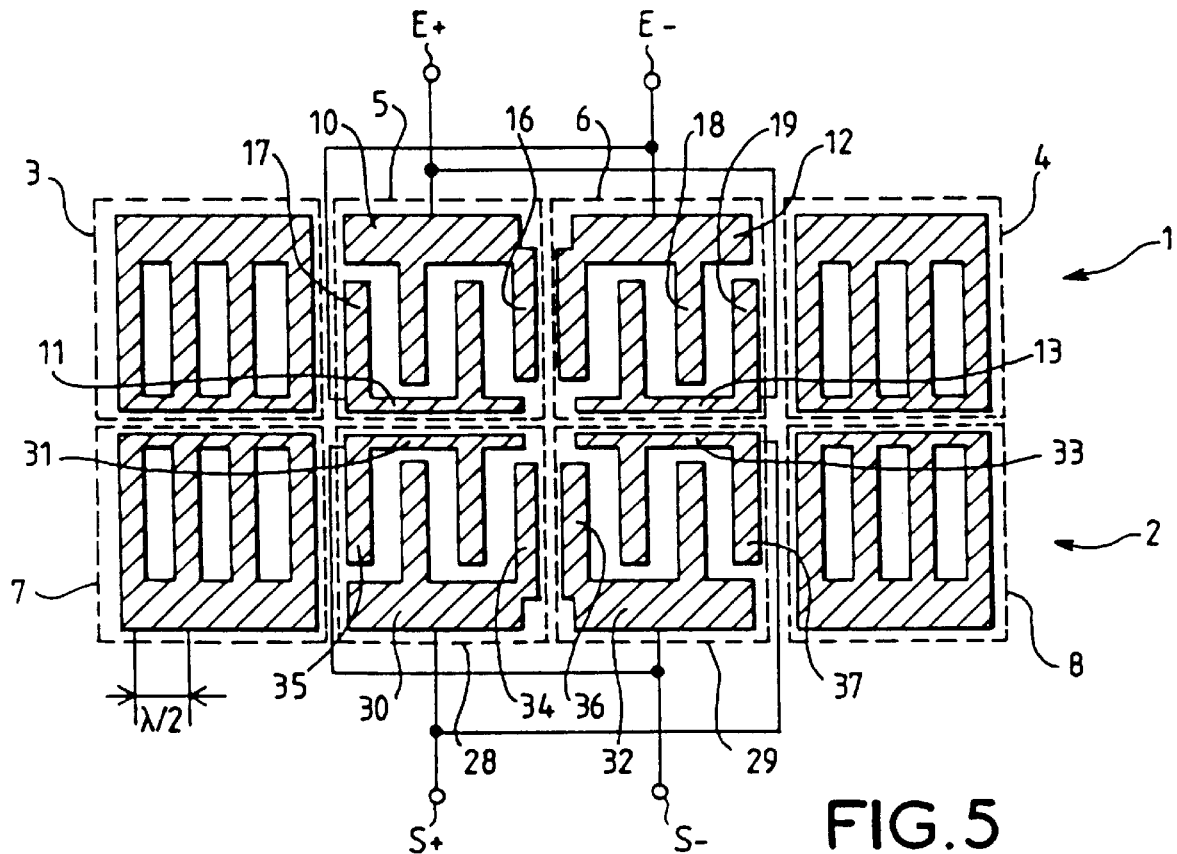
FIG. 5 is a drawing of the electrodes of the filter shown in FIG. 4.
Figure 6:
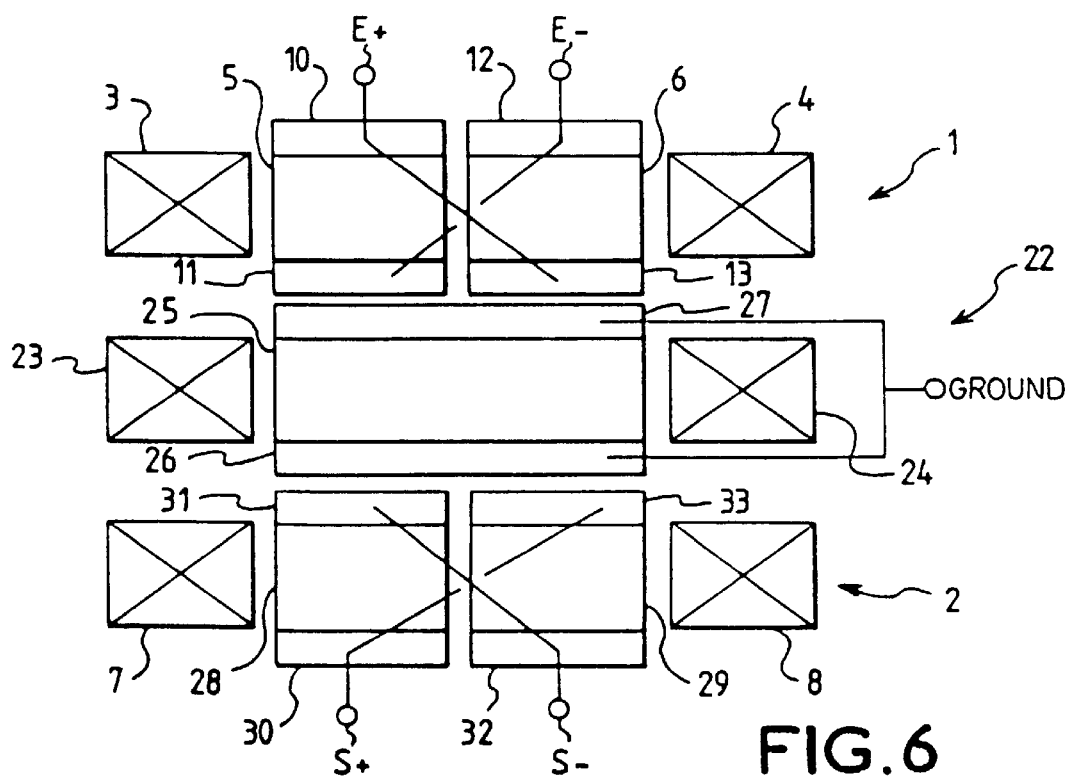
FIG. 6 shows a three-pole filter according to a fourth embodiment of the invention.
Figure 7:
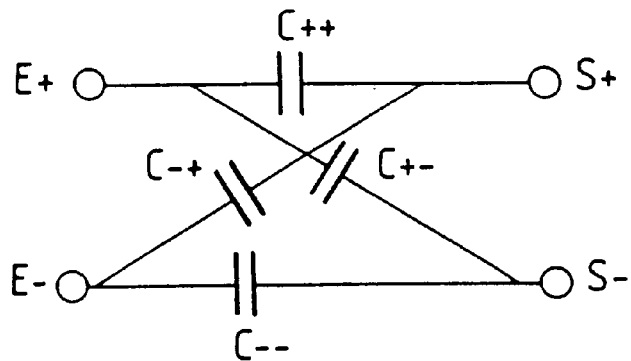
FIG. 7 shows the different mutual capacitances between the transducers of the filter shown in FIG. 4.

Thus, filter structure shown in FIGS. 4, 5 and 6 has the advantage of a symmetry between the two differential inputs E+ and E− as well as between the two differential outputs S+ and S−. However, a major feature that comes into play in the rejection is the balancing of the mutual capacitances between the transducer of the resonator connected to the input and the transducer of the resonator connected to the output in the case of a filter with two resonators coupled by proximity as shown in FIG. 4. These capacitances may be shown schematically as illustrated in FIG. 7. The balancing of the mutual capacitances is achieved when the following relationships are met:

$$C_{++} = C_{-+} \qquad (1)$$

$$C_{--} = C_{+-} \qquad (2)$$

Under these conditions, there is no direct capacitive passage between the input and the output. The relationships (1) and (2) are not met with the structure of the filter shown in FIGS. 4 and 5. The geometry of this structure makes it possible only to write:

$$C_{++} = C_{--} \qquad (3)$$

$$C_{+-} = C_{-+} \qquad (4)$$

The relationships (3) and (4) do not enable the elimination of direct passage between the input and the output by capacitive coupling as is the case with the structure whose output is non-differential.

A variant of the invention is used to overcome this drawback. The structure of the corresponding filter is shown in FIGS. 8 and 9.

Figure 8:
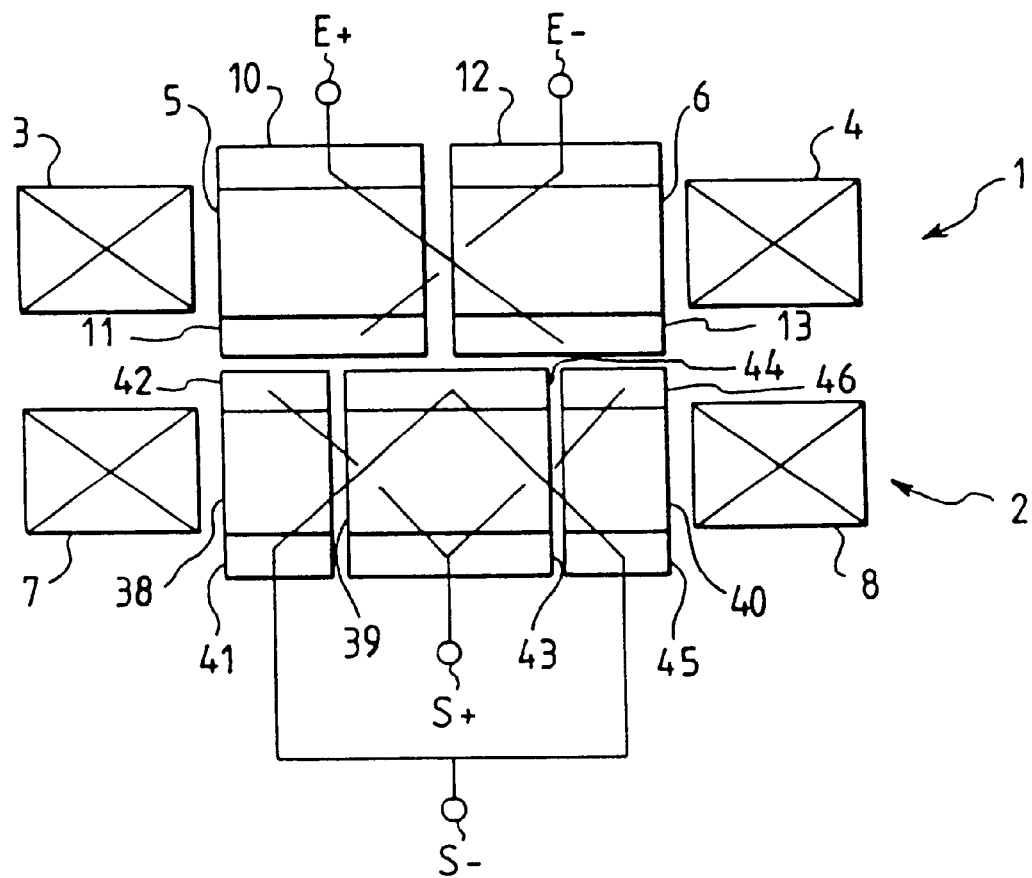
FIG. 8 shows a two-pole filter according to a fifth embodiment of the invention.
Figure 9:
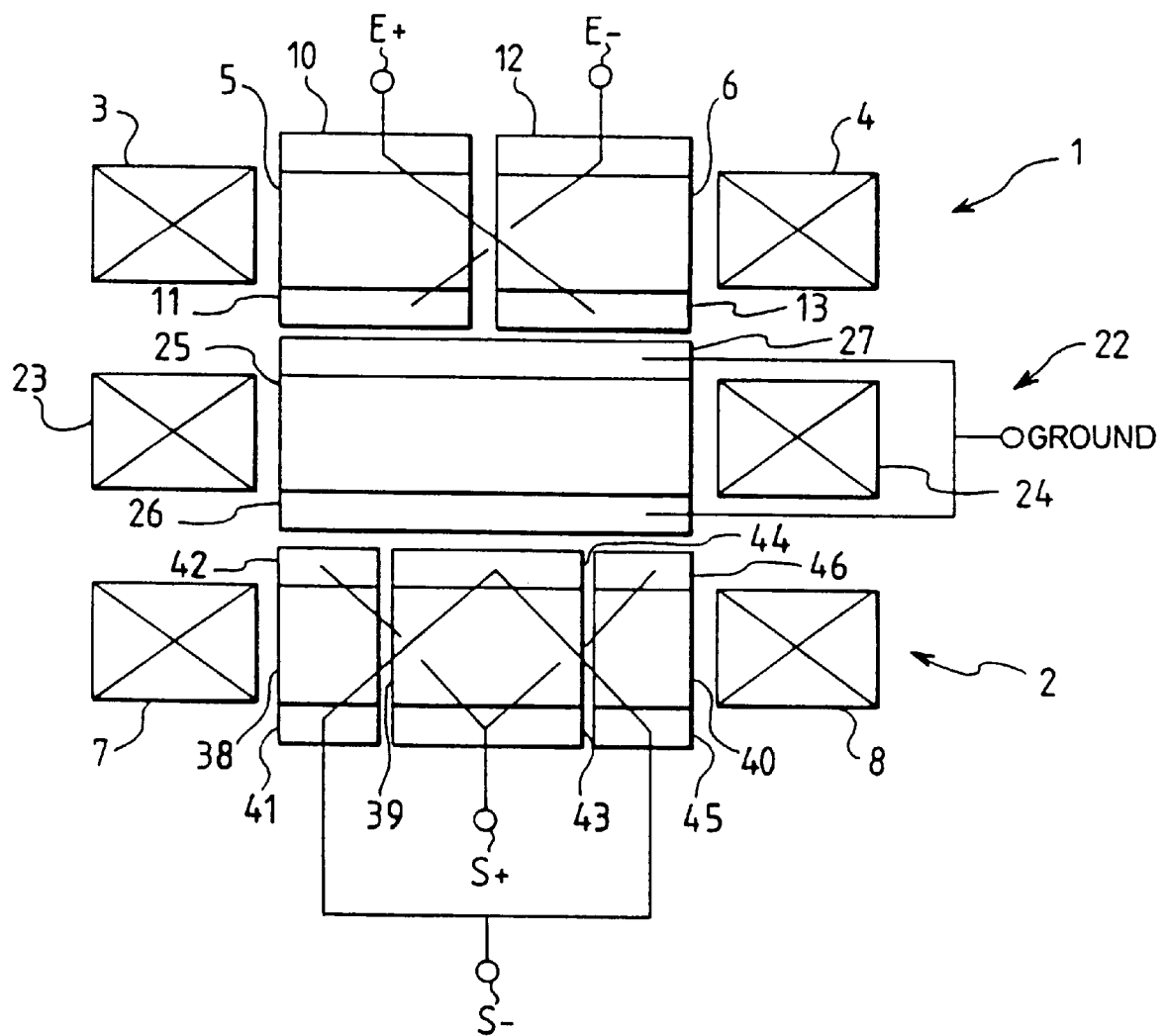
FIG. 9 shows a three-pole filter according to a sixth embodiment of the invention.

FIG. 8 shows a two-pole filter. To reduce the direct passage between the input and the output, the structure shown in FIGS. 4 and 5 has been modified in the resonator 2 connected to the differential outputs, S+ and S−. The transducer of the resonator 2 connected to the differential outputs S+ and S− is subdivided into three parts to form a first transducer 38, a second transducer 39 and a third transducer 40, each comprising two connection buses, respectively 41 and 42, 43 and 44, and 45 and 46. The length of each of the transducers is respectively about one-fourth, one-half and one-fourth of the length of transduction of the resonator 1 connected to the differential inputs E+ and E− defined by the total length of the transducers of this resonator.

The three transducers 38, 39 and 40, positioned one beside the other, are parallel-connected in accordance with the rules already described here above with reference to FIG. 1. Thus, the structure of the filter simultaneously shows a symmetry between the differential inputs E+ and E−, a symmetry between the differential outputs S+ and S− and a symmetry between the mutual capacitance values. FIG. 9 shows the same filter structure for a three-pole filter. The invention has been described essentially with reference to two-pole filters and three-pole filters. Filters according to the invention with a greater number of poles may be obtained by the cascade connection of two-pole filters or three-pole filters or else by coupling a sufficient number of resonators according to the principle described with reference to FIGS. 3, 6 and 9. Furthermore, in certain cases, single transducers have an operation identical to that of a resonator and the gratings may then be very short (for example with 10 to 50 fingers) or non-existent. The resonators that are not connected to the inputs or outputs in the case of filters with a number of poles greater than two have been described as being formed by a transducer between two gratings. However, since these resonators are connected to the ground, the transducer could advantageously be replaced by a short-circuited electrode grating. Finally, it has been assumed in the above examples that each acoustical channel is formed by a resonator, these resonators having only one mode of resonance. It is clearly possible to extend the scope of the invention to any type of surface acoustic wave device using the proximity coupling of several acoustical channels, whether these channels are formed by resonators or not. In particular, it is possible to obtain a device having, on the same acoustic channel, an input supplied in differential mode as well as an output.

The invention has been described essentially with reference to particular examples of surface acoustic wave filters fitted out with differential inputs. The invention can be applied, according to the same principle, to devices fitted out with a single input and differential outputs.

It is also possible to obtain a device that has no output, only the impedance perceived between the inputs being used to obtain a filter for example.

What is claimed is:

1. A surface acoustic wave device using a proximity coupling of a whole number N of acoustic channels, where N is at least equal to two, with a given transduction length, these acoustic channels being positioned in parallel on a substrate and numbered successively 1 to N, wherein said device comprises a first particular acoustic channel comprising at least one transducer, comprising two connection buses extended by electrodes, separated into several parts electrically connected in parallel with one another to form a first differential port (E+) and a second differential port (E−), the polarities of the different parts of the transducer being chosen so that the first differential port (E+) and the second differential port (E−) are electrically symmetrical.

2. A device according to claim 1, further comprising a second particular acoustic channel connected to a third port.

3. A device according to claim 2, wherein the first particular acoustic channel corresponds to the acoustic channel numbered 1 of the device and wherein the second particular acoustic channel corresponds to the acoustic channel numbered N of the device and wherein the first differential port and the second differential port form a first differential input (E+) and a second differential input (E−) of the device and wherein the third port forms an output (S) of the device.

4. A device according to claim 3, wherein the acoustic channel numbered N comprises at least one transducer separated into several parts that are electrically connected in parallel to one another, achieving a subdivision of the output (S) into a first differential output (S+) and a second differential output (S−), the polarities of the different parts of the transducer being chosen so that the first differential output (S+) and second differential output (S−) are electrically symmetrical.

5. A device according to claim 4, wherein the parts of the transducer of the acoustic channel numbered 1 have a length equal respectively to about one-fourth, one-half and one-fourth of the length of transduction of this same channel.

6. A device according to claim 4, wherein the parts of the transducer of the acoustic channel numbered N have a length equal respectively to about one-fourth, one-half and one-fourth of the length of transduction of this same channel.

7. A device according to claim 2, wherein the first particular acoustic channel corresponds to the acoustic channel numbered N of the device and wherein the second particular acoustic channel corresponds to the acoustic channel numbered 1 of the device and wherein the first differential port and the second differential port form a first differential output (S+) and a second differential output (S−) of the device, and wherein the third port forms an input of the device.

8. A device according to claim 7, wherein the parts of the transducer of the acoustic channel numbered N have a length equal respectively to about one-fourth, one-half and one-fourth of the length of transduction of this same channel.

9. A device according to claim 7, wherein the electrodes of the transducer of the acoustic channel numbered N are cut out to form a regular succession of interdigited fingers forming an alternation of positive and negative electrical polarities.

10. A device according to claim 9, wherein each of the N acoustic channels coupled by proximity is constituted by a resonator consisting of a transducer between two reflector gratings.

11. A device according to claim 1, wherein the electrodes of the transducer of the first particular acoustic channel are cut out to form a regular succession of interdigitated fingers forming an alternation of positive and negative electrical polarities.

12. A device according to claim 1, wherein each of the N acoustic channels coupled by proximity is constituted by a resonator consisting of a transducer between two reflector gratings.

13. A device according to claim 12, wherein the resonator of the acoustic channel numbered 1 and the resonator of the acoustic channel numbered N have an identical structure, symmetrical with each other with respect to the axis of propagation of the surface acoustic waves.

* * * * *